US011131715B2

(12) United States Patent
Hellgren

(10) Patent No.: US 11,131,715 B2
(45) Date of Patent: Sep. 28, 2021

(54) BATTERY MANAGEMENT SYSTEM AND A METHOD FOR CONTROLLING A BATTERY MANAGEMENT SYSTEM

(71) Applicant: VOLVO TRUCK CORPORATION, Gothenburg (SE)

(72) Inventor: Jonas Hellgren, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 187 days.

(21) Appl. No.: 16/466,192

(22) PCT Filed: Dec. 21, 2016

(86) PCT No.: PCT/EP2016/082248
§ 371 (c)(1),
(2) Date: Jun. 3, 2019

(87) PCT Pub. No.: WO2018/113962
PCT Pub. Date: Jun. 28, 2018

(65) Prior Publication Data
US 2020/0070682 A1    Mar. 5, 2020

(51) Int. Cl.
*G01R 31/367* (2019.01)
*B60L 58/12* (2019.01)
(Continued)

(52) U.S. Cl.
CPC ............ *G01R 31/367* (2019.01); *B60L 58/12* (2019.02); *B60K 6/22* (2013.01); *B60L 3/0046* (2013.01);
(Continued)

(58) Field of Classification Search
CPC . G01R 31/367; B60L 58/12; B60L 2240/545; B60L 58/10; B60L 2240/54;
(Continued)

(56) References Cited

U.S. PATENT DOCUMENTS 10,162,010 B2 * 12/2018 Zhang .................... H02J 7/0021
10,197,631 B2 *  2/2019 Barfield, Jr. ........... G07C 5/008
(Continued)

FOREIGN PATENT DOCUMENTS

CN        1913217 A    2/2007
CN      101750584 A    6/2010
(Continued)

OTHER PUBLICATIONS

China Office Action dated Dec. 28, 2020 in corresponding China Patent Application No. 201680091324.8, 12 pages.
(Continued)

*Primary Examiner* — Stacy Whitmore
(74) *Attorney, Agent, or Firm* — Venable LLP; Jeff A. Kaminski

(57) ABSTRACT

The invention relates to a method of controlling a vehicle battery management system comprising a battery arranged in a vehicle, the battery being controlled by a battery control unit comprising a battery model describing a relation between a battery state and a time varying battery property. The method comprises, in the battery control unit: measuring at least one time varying battery sensor output of the battery; determining a battery state based on the measured battery sensor output; updating the battery model based on the determined battery state, thereby forming an updated battery model, receiving a second battery model; and combining the received second model with the existing battery model. The invention also relates to a battery management system and to a vehicle comprising such a battery management system.

18 Claims, 4 Drawing Sheets

(51) Int. Cl.
    *B60K 6/22*    (2007.10)
    *B60L 3/00*    (2019.01)
    *B60L 58/10*   (2019.01)

(52) U.S. Cl.
    CPC ........... *B60L 58/10* (2019.02); *B60L 2200/18* (2013.01); *B60L 2200/36* (2013.01); *B60L 2200/40* (2013.01); *B60L 2240/54* (2013.01); *B60L 2240/545* (2013.01); *B60Y 2200/11* (2013.01); *B60Y 2200/41* (2013.01); *B60Y 2200/91* (2013.01); *B60Y 2200/92* (2013.01); *Y02T 10/70* (2013.01); *Y02T 90/16* (2013.01)

(58) Field of Classification Search
    CPC ............... B60L 3/0046; B60L 2200/36; B60L 2200/18; B60L 2200/40; B60K 6/22; B60Y 2200/91; B60Y 2200/92; B60Y 2200/145; B60Y 2200/143; B60Y 2200/41; B60Y 2200/11; Y02T 10/70; Y02T 90/16

See application file for complete search history.

(56) References Cited

U.S. PATENT DOCUMENTS

| | | | |
    |---|---|---|---|
    | 10,328,802 B2 * | 6/2019 | Gaither | ................... B60T 8/172 |
    | 10,556,598 B2 * | 2/2020 | Petrak | ................... B60W 50/14 |
    | 2004/0081867 A1 | 4/2004 | Edlund | |
    | 2006/0009888 A1 * | 1/2006 | Atsumi | ................... B60L 58/12 |
    | | | | 701/22 |
    | 2006/0100800 A1 | 5/2006 | Ahmed et al. | |
    | 2012/0098481 A1 | 4/2012 | Hunter et al. | |
    | 2013/0085696 A1 | 4/2013 | Xu et al. | |
    | 2013/0262067 A1 * | 10/2013 | Zhang | ................ G05B 23/0283 |
    | | | | 703/8 |
    | 2015/0066231 A1 | 3/2015 | Clifton | |
    | 2015/0251556 A1 | 9/2015 | Meyer | |
    | 2015/0362559 A1 | 12/2015 | Hametner et al. | |
    | 2016/0349330 A1 | 12/2016 | Barfield, Jr. et al. | |

FOREIGN PATENT DOCUMENTS

| | | | | |
    |---|---|---|---|---|
    | CN | 103033752 A | | 4/2013 | |
    | CN | 103270668 A | | 8/2013 | |
    | CN | 103364203 A | | 10/2013 | |
    | CN | 105008946 A | | 10/2015 | |
    | CN | 105277890 A | | 1/2016 | |
    | CN | 105378497 A | | 3/2016 | |
    | CN | 102959418 B | | 4/2016 | |
    | CN | 105717457 A | * | 6/2016 | |
    | JP | 2016048617 A | | 4/2016 | |
    | WO | WO-2015101570 A1 | * | 7/2015 | ........... G01R 31/392 |
    | WO | 2016082208 A1 | | 6/2016 | |

OTHER PUBLICATIONS

International Search Report and Written Opinion dated Oct. 11, 2017 in International Application No. PCT/EP2016/082248.

* cited by examiner

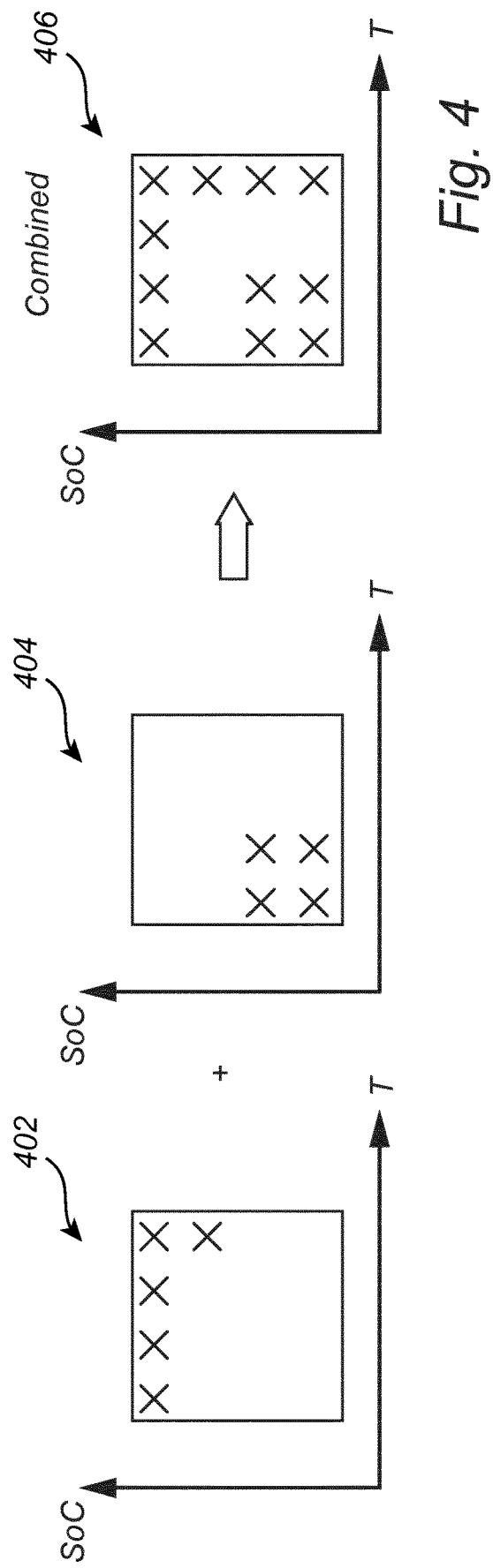

BATTERY MANAGEMENT SYSTEM AND A METHOD FOR CONTROLLING A BATTERY MANAGEMENT SYSTEM

TECHNICAL FIELD

A battery management system for controlling a battery in a vehicle, and a method for controlling such a battery management system.

The invention can be applied in heavy-duty vehicles, such as trucks, buses and construction equipment. Although the invention will be described with respect to a bus, the invention is not restricted to this particular vehicle, but may also be used in other vehicles such as cars as well as heavy-duty vehicles.

BACKGROUND

In a hybrid or electric vehicles, it is important to have a good knowledge of battery properties for various operating conditions. To achieve that, an electric vehicle often comprises a battery management system tasked with monitoring the status of the battery.

In particular, objectives of the battery management system are (1), energy level state monitoring, i.e. state of charge estimation (2), power capacity state monitoring (3), maintaining of safe operation of the battery pack (4), state of health estimation and (5) ensuring that the cells in the battery pack are balanced. Sensor signals, such as voltage, current and temperature, are combined with mathematical models to achieve the previously listed objectives. The mathematical models include parameters describing cell properties such as for example resistance, capacity and open circuit voltage. Setting of these parameters is essential for efficient state monitoring. Typically the cell parameter setting is performed in a laboratory enabling good control of cell load, temperature etc.

However, cell parameter setting is complex for example due to multidimensional relationships between parameters and operating conditions. For example, cell resistance may depend both on temperature, state of charge and current. Another reason for the complexity is battery degradation, meaning that battery properties will change over time. US2012/0098481 describes an apparatus for charging a battery. The described charging system also includes a database for accumulating battery parameter data from a plurality of batteries and a processor for recursively updating data characterizing a model representing the battery based both on jointly measured battery voltage and current and accumulated parameter data received from the database. Finally, the apparatus has a current supply for supplying current for charging the battery as governed by the processor.

However, the described system only gives a limited view of the battery properties, and it is desirable to provide an improved and more detailed battery management system.

SUMMARY

An objective of the invention is to provide a method and system for controlling a battery management system such that a more accurate battery model can be provided.

According to a first aspect of the invention, the objective is achieved by a method of controlling a battery management system according to claim 1.

Accordingly, there is provided a method of controlling a vehicle battery management system comprising a battery arranged in a vehicle, the battery being controlled by a battery control unit comprising a battery model describing a relation between a battery state and a time varying battery property. The method comprises, in the battery control unit: measuring at least one time varying battery sensor output; determining a battery state based on the measured battery sensor output; updating the battery model based on the measured battery property, thereby forming an updated battery model, receiving a second battery model; and combining the received second model with the existing battery model, wherein the second battery model is received from a second battery control unit controlling a second battery in a second vehicle. Thereby, since a battery management unit in the first vehicle can receive information from a second vehicle, the battery model in the first vehicle can be made more accurate, assuming that the batteries of the two vehicles are of the same or similar type. In particular, the second vehicle may have experienced different operating conditions in comparison to the first vehicle, thereby in turn having measured battery properties and determined battery states for other operating conditions.

In the present context, a battery property may be a directly measured time varying property, herein referred to as a sensor output, or a battery property may be a calculated, i.e. determined, time varying property, herein referred to as a battery state. A sensor output (i.e. a measured time varying property) can here be a measured current, voltage or temperature. Moreover, a battery state may depend on both directly measured battery properties as well as on calculated battery properties (i.e. other battery states), as will be exemplified in the following. A battery operating condition defines the overall properties of the battery at a given point in time. Accordingly, the battery operating condition can be said to include all of the measured and determined battery properties at a given point in time. The battery operating conditions may also include information describing parameters external to the battery, such as vehicle and environmental conditions.

It is thus assumed that the battery management system comprises battery sensors, or the like, for measuring battery parameters such as current, voltage and temperature.

Hereby, a method is provided which improves the accuracy of the battery model by updating the battery model based on the measured battery property, which in turn leads to a determination of a battery state, and by further updating the battery model based on a received second battery model. The battery model can thereby be dynamically updated in the vehicle, based both on properties of the battery in the vehicle and based on a second battery model which may describe battery states of other batteries, without connecting the vehicle to a charging station. This can also be referred to as experience sharing, where vehicles can share their respective battery models, and learn from other vehicles. Accordingly, more precise estimation of the battery states for varying battery operating conditions can be achieved in a vehicle, which has positive effects such as more efficient cell balancing and better battery energy utilization. Moreover, since there is no need to connect the vehicle to a charging station to update the battery model, both electric and hybrid vehicles can benefit from the described method. Furthermore, the described method includes battery properties acquired during operation of the vehicle, i.e. during use of the batteries. In addition to more precise estimation of the battery states, the estimation of battery states implicitly gives the possibility to track the battery state of health. The reason is the coupling between battery state of health and battery properties such as resistance.

According to one embodiment of the invention, the battery model may comprise a function describing the battery state as a function of the time varying battery property. Hereby, the function itself can be updated based on the measured battery property for the given time dependent battery state. An advantage of providing a function describing the relationship is that also property values and battery states for operating conditions which are not previously experienced may be estimated. How a battery state is related to a battery property may for example be described using a polynomial function, tile coding or neural networks. However, other mathematical functions may also be used.

According to one embodiment of the invention, the battery model may comprise a state map describing the relation between the battery state and the time varying battery property for a range of battery property values. By means of the state map, a more complete description of a battery state for a range of battery operating conditions can be provided. Moreover, the use of a state map makes it easy to access previously estimated battery states for a known set of operating conditions since no calculations are required. Instead, the battery property can be acquired directly from the map.

According to one embodiment of the invention, a first state map in the vehicle may describe a relation between a battery state and a time varying battery property for a first set of battery property values, and a received second state map may describe a relation between a battery state and a time varying battery property for a second set of battery property values, the first set of battery property values being different from the second set of battery property values, wherein the method comprises combining the first and second state maps. That the first set and second set of battery property values are different should in the present context be understood to mean that the maps comprise battery state values for different, non-overlapping, battery property values.

According to one embodiment of the invention, combining the first and second state maps comprises adding battery states from the second state map to the first state map for non-overlapping battery property values. Hereby, a more complete state map for a battery can be achieved adding previously unknown battery property values to the map to form a combined state map.

According to one embodiment, the battery model may describe a battery resistance or a battery capacity as a function of temperature, state-of-charge and/or state-of-health. Accordingly, the temperature, state-of-charge and/or state-of-health are examples of time varying battery properties, and the battery resistance and battery capacity are examples of determined battery states. Hereby, battery states can be determined for a wide range of values of the battery properties corresponding to various operating conditions of the vehicle, thus improving the accuracy of the model.

According to a further embodiment of the invention, the battery model may describe a time derivative of a battery state-of-health as a function of temperature, state-of-charge and/or current. Accordingly, the time derivative of a battery state-of-health is the determined battery state. Moreover, by observing the time dependent behaviour of a battery state as a function of a time varying battery property, a detailed model accurately describing also dynamic properties of the battery can be provided.

According to one embodiment of the invention, the method may further comprise transmitting the second model from a second battery control unit in a second vehicle to a first battery control unit in a first vehicle when the first and second vehicles are within a distance of each other allowing direct communication between the first and second vehicles. This is advantageous since it allows for automatically updating the battery models when vehicles having similar batteries are near each other. This may for example occur in parking lots, at distribution centers, at gas stations or even on the road as the vehicles are moving.

According to one embodiment of the invention the transmission may be performed via vehicle-to-vehicle communication, Bluetooth or WiFi. Hereby, means of communication already existing in the vehicle may be used to update the battery model and thereby improve the battery utilization. Accordingly, the described battery management system could be retrofitted in an existing vehicle without the need for substantial modifications relating to communication capabilities.

According to one embodiment of the invention the method may further comprise transmitting the second model from a second battery control unit in a second vehicle to a first battery control unit in a first vehicle via a battery control server. Hereby, a centralized server could gather information from a large number of vehicles, thereby describing battery states for a wide range of operating states, making updating the battery management systems even more effective.

There is also provided a computer program comprising program code means for performing the steps of any of above described embodiments when the program is run on a computer, and a computer readable medium carrying the aforementioned computer program.

According to a second aspect of the invention, there is provided a battery control system comprising: a first battery comprising a first battery control unit, arranged in a first vehicle, wherein the first battery control unit is configured to measure at least one time varying sensor output and to determine a battery state based on the measured battery sensor output. The first battery control unit comprises a battery model describing a relation between a battery state and a time varying battery property, wherein the first battery control unit is further configured to update the battery model based on the determined battery state to form an updated battery model; and the first battery control unit is configured to receive a second battery model; and to combine the received second battery model with the existing updated battery model.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings:

FIG. 4 schematically illustrates a state map of a battery control system according to an embodiment of the invention.

DETAILED DESCRIPTION OF EXAMPLE EMBODIMENTS OF THE INVENTION

In the present detailed description, various embodiments of the battery control system and method according to the present invention are mainly described with reference to heavy vehicle comprising a hybrid propulsion system in the form of a combination of battery powered electric motors and an internal combustion engine. However, it should be noted that various embodiments of the described invention are equally applicable for a wide range of hybrid and fully electrical vehicles.

Figure 1:
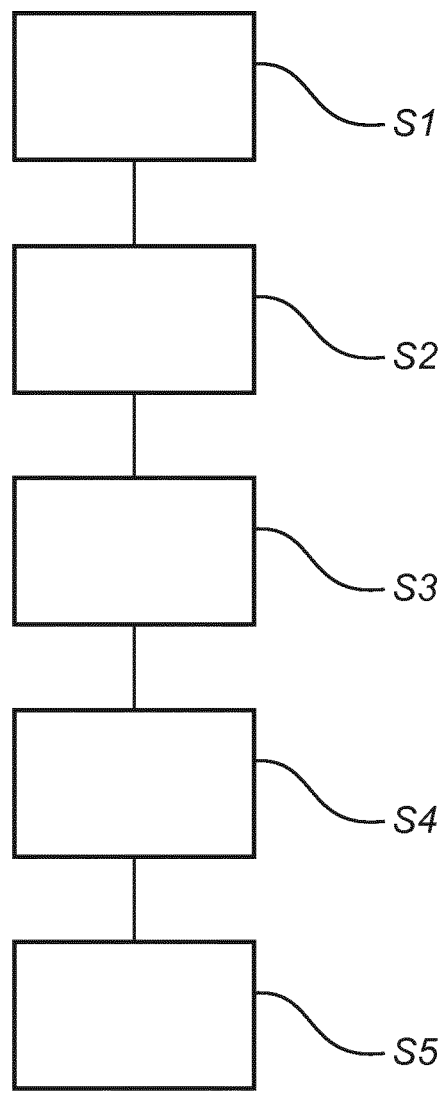
FIG. 1 is a flow chart outlining the general steps of a method according to an embodiment of the invention.

FIG. 1 is a flow chart outlining the general steps of a method of controlling a vehicle battery management system 100 according to an embodiment of the invention. The method of FIG. 1 will be described with further reference to the vehicle 110 comprising a battery management system 100 illustrated in FIG. 2. The battery management system comprises a battery 102 and a battery control unit 104 configured to control the battery 102.

The battery control unit 104 may be a dedicated control unit configured to control a battery in a hybrid or electrical propulsion system of a vehicle, or it may be a general purpose control unit. The battery control unit 104 may include a microprocessor, microcontroller, programmable digital signal processor or another programmable device. Thus, the battery control unit 104 comprises electronic circuits and connections (not shown) as well as processing circuitry (not shown). The battery control unit 204 may comprise modules in either hardware or software, or partially in hardware or software and communicate using known transmission buses such as CAN-bus and/or wireless communication capabilities. The processing circuitry may be a general purpose processor or a specific processor. The battery control unit 104 comprises a non-transitory memory for storing computer program code and data upon. Thus, the skilled addressee realizes that the battery control unit 104 may be embodied by many different constructions.

In a first step, the method comprises, in the battery control unit 104, measuring S1 at least one time varying battery sensor output of the battery 102, where the sensor output is a current (I), a voltage (V), or a temperature (T). Based on the measured battery sensor output, a battery state can be determined S2. Next, the method comprises updating S3 the battery model based on the determined battery state, thereby forming an updated battery model. In a following step, the battery management system 100 receives S4 a second battery model; and finally, the received second model is combined S5 with the existing battery model, in order to form a resulting combined battery model.

As described earlier, the term "battery property" here encompasses both a directly measured time varying property as well as a determined, calculated, battery property. A measured property is further referred to as a sensor output, and a calculated, i.e. determined, battery property is referred to as a battery state. A sensor output can be a measured current, voltage or temperature, which can be measured using dedicated sensors or other instruments in the battery management system.

It should be noted that the described method steps must not be performed in the precise order in which they are listed. For example, the step of receiving S4 a second battery model may equally well be performed prior to the step of measuring S1 a battery sensor output.

Figure 2:
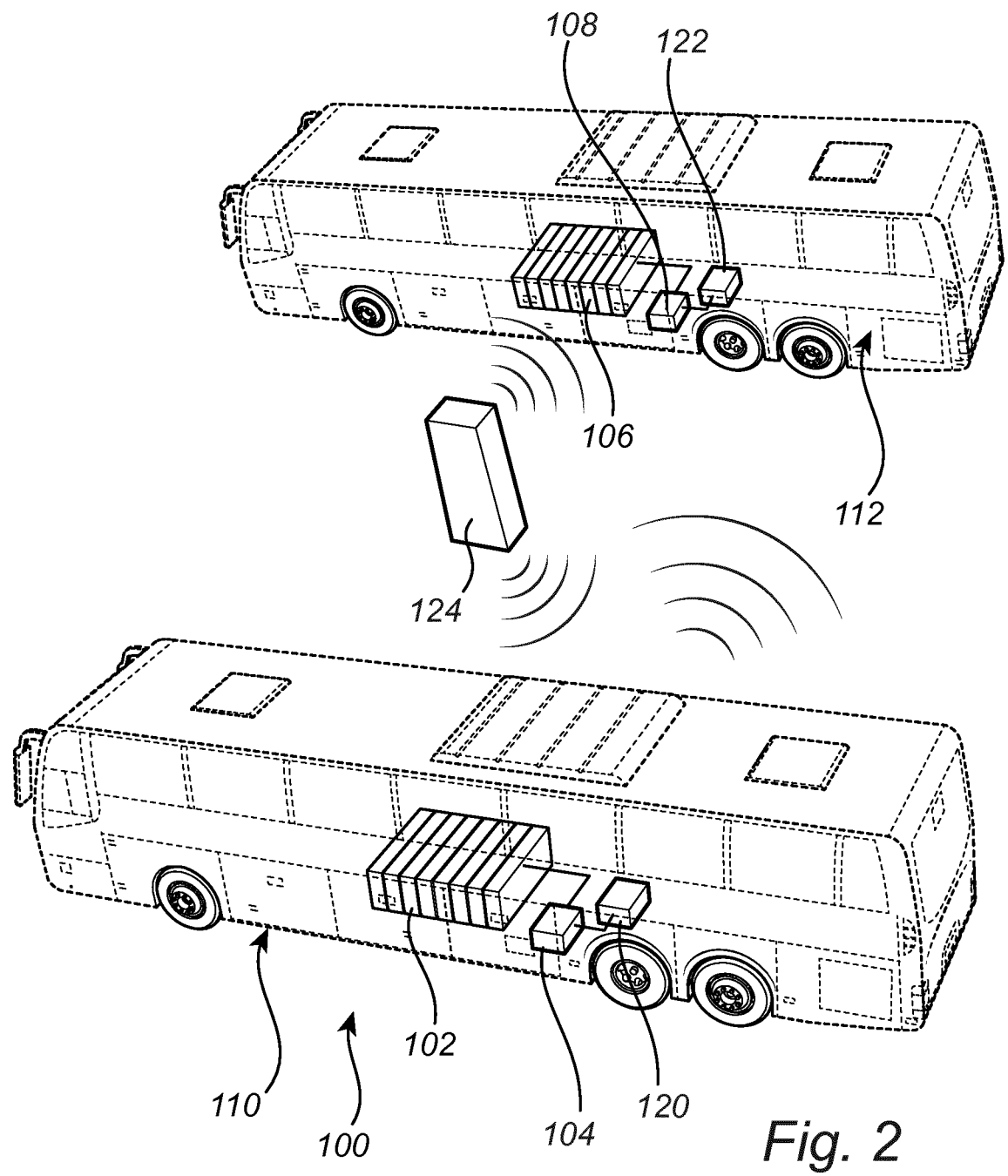
FIG. 2 schematically illustrates a vehicle comprising a battery control system according to an embodiment of the invention.

In addition to the battery management system 100, FIG. 2 further illustrates vehicles 110, 112 comprising the battery control system. Here, the illustrated vehicle is a bus. However, the described method and system may equally well be used in other types of vehicles, e.g. trucks, construction equipment, cars etc.

In the first vehicle 110, the battery management system comprises a first battery 102 and a first battery control unit 104. The first battery control unit 104 is configured to perform the method described above with reference to FIG. 1. FIG. 2 further comprises a second vehicle 112 comprising a second battery control unit 108 controlling a second battery 106 in the second vehicle 112. Hereby, the second battery model can be received from the second battery control unit 108. It can be assumed that the second battery model describes a relation between the same battery state and time varying battery property as the first battery model does. In other words, a battery model in the first vehicle 110 is updated using a battery model from the second vehicle 112.

In order to efficiently communicate with other vehicles, each vehicle comprises communication units 120, 122, including transmitting and receiving functionality.

Accordingly, a transmitter 122 of the second vehicle 112 can be configured to transmit the second battery model to the receiver 120 in the first vehicle 110 when the first and second vehicles 110, 112 are within a distance of each other allowing direct communication between the vehicles 110, 112. The communication units 120, 122, may for example be vehicle-to-vehicle (V2V) communication units, Bluetooth or WiFi transceivers. It is also possible that a vehicle is equipped with several different types of communication units.

As further illustrated in FIG. 2, communication between vehicles may take place via a battery control server 124 configured to receive and store the updated battery model from the first battery control unit 104, and/or from the second battery control unit 108. The battery control server 124 can be used to store and maintain battery models from a large number of vehicles. Thereby, a vehicle can communicate with the battery control server to receive an updated battery model based not only on one other battery, but based on a large number of batteries in different vehicles. Thereby, a more detailed battery model can be achieved since it can be assumed that batteries in different vehicle experience different operating conditions, thereby providing a more complete model.

Figure 3A:
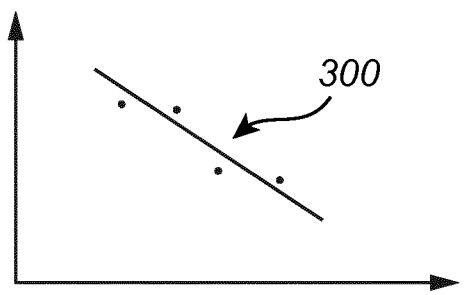
FIGS. 3A-C schematically illustrates mathematical models of a battery control system according to an embodiment of the invention.
Figure 3B:
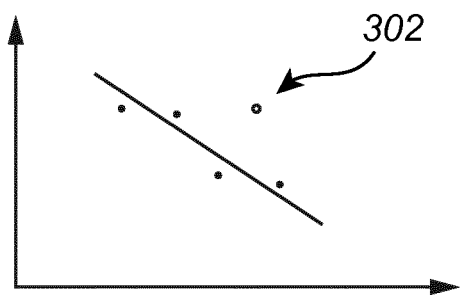
Figure 3C:
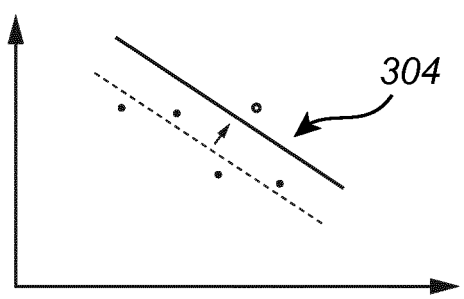

FIGS. 3A-C schematically illustrate a battery model and how a battery model may be updated based on measured battery property and resulting determined battery state. In FIG. 3A, the model is for simplicity illustrated as a linear model 300. It should be understood that the mathematical models determining the battery properties may be much more complex. The example model 300 describes state-of-charge as a function of temperature. In FIG. 3B, the result 302 of a measurement is introduced into the model, i.e. the resulting battery state based on the measured sensor output. Based on the newly determined battery state, the model is updated, e.g. by means of a linear fit to the data points including the newly added data point, thereby forming an updated model 304. A battery model may thus start with only basic information of the battery properties and then learn empirically from measurements as well as from other batteries, based on other operating conditions of the battery.

The battery model may for example describe a resistance R, as a function of temperature, T, state-of-charge (SoC) or state-of-health (SoH) (i.e. R(T), R(SoC), R(SoH)), battery capacity as a function of T, SoC, SoH and/or the time derivative d/dt(SoH) vs T, I, SoC etc.

FIG. 4 schematically illustrates a battery model in the form of a battery state map 402 in a first vehicle 110. The state map describes a relation between a battery state and a time varying battery property. In the present example, the state map illustrates SoC vs temperature. A second state map 404 describing a relation between a battery state and a time varying battery property for a second set of battery property values is received from a second vehicle 112. Finally the two state maps are combined to form a resulting combined state map 406.

In the example illustrated in FIG. 4, the two state maps 402, 404 does not comprise any overlapping data points, so the combined state map 406 is simply formed by adding all of the data points from one map to the other. In a situation where the received condition map comprises data points overlapping the data points already existing in the first state map, there are a number of different ways to handle the overlapping data points. The overlapping data points of the second state map may simply be ignored, they may be combined with the data points of the first map by forming an average, or by forming a weighted average where either data point may be averaged using a selected weight.

It is to be understood that the present invention is not limited to the embodiments described above and illustrated in the drawings; rather, the skilled person will recognize that many changes and modifications may be made within the scope of the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A method of controlling a vehicle battery management system comprising a battery arranged in a vehicle, the battery being controlled by a battery controller comprising a battery model describing a relation between a battery state and a time varying battery property, said battery model comprises a state map describing said relation between said battery state and said time varying battery property for a range of battery property values, wherein a first state map in said vehicle describes a relation between a battery state and a time varying battery property for a first set of battery property values, and wherein a received second state map describes a relation between a battery state and a time varying battery property for a second set of battery property values, said first set of battery property values being different from said second set of battery property values, the method comprising, in the battery controller: combining said first and second state maps, measuring at least one time varying battery sensor output; determining a battery state based on said measured battery sensor output; updating said battery model based on the determined battery state, thereby forming an updated battery model; receiving a second battery model; and combining the received second model with the existing battery model, and wherein the second battery model is received from a second battery control unit controller controlling a second battery in a second vehicle.

2. The method according to claim 1, wherein said battery model comprises a function describing said battery state as a function of said time varying battery property.

3. The method according to claim 1, wherein combining said first and second state maps comprises adding battery states from said second state map to said first state map for non-overlapping battery property values.

4. The method according to claim 1, wherein said battery model describes a battery resistance or a battery capacity as a function of temperature, state-of-charge and/or state-of-health.

5. The method according to claim 1, wherein said battery model describes a time derivative of a battery state-of-health as a function of temperature, state-of-charge and/or current.

6. The method according to claim 1, further comprising transmitting said second model from a second battery controller in a second vehicle to a first battery controller in a first vehicle when said first and second vehicles are within a distance of each other allowing direct communication between said first and second vehicles.

7. The method according to claim 6, wherein said transmission is performed via vehicle-to-vehicle communication, Bluetooth or WiFi.

8. The method according to claim 1, further comprising transmitting said second model from a second battery controller in a second vehicle to a first battery controller in a first vehicle via a battery control server.

9. A computer program comprising program code means for performing the steps of claim 1 when said program is run on a computer.

10. A computer readable medium carrying a computer program comprising program code means for performing the steps of claim 1 when said program product is run on a computer.

11. A battery management system comprising: a first battery comprising a first battery controller, arranged in a first vehicle, wherein said first battery controller is configured to measure at least one time varying battery sensor output and to determine a battery state based on said measured battery sensor output; a second battery comprising a second battery controller controlling said second battery in a second vehicle, said first battery controller comprising a battery model describing a relation between a battery state and a time varying battery property, said battery model comprises a state map describing said relation between said battery state and said time varying battery property for a range of battery property values, a first state map in said vehicle describes a relation between a battery state and a time varying battery property for a first set of battery property values, and wherein a received second state map describes a relation between a battery state and a time varying battery property for a second set of battery property values, said first set being different from said second set of battery property values, and said first and second state maps are combined, wherein said first battery controller is further configured to update said battery model based on the determined battery state to form an updated battery model; and said first battery controller being configured to receive a second battery model from said second battery controller; and to combine the received second battery model with the existing updated battery model.

12. The system according to claim 11, wherein said battery model comprises a function describing said battery state as a function of said time varying battery property.

13. The system according to claim 11, wherein combining said first and second state maps comprises adding battery states from said second state map to said first state map for non-overlapping battery property values.

14. The system according to claim 11, wherein said battery model describes a battery resistance or a battery capacity as a function of temperature, state-of-charge and/or state-of-health.

15. The system according to claim 11, wherein said battery model describes a time derivative of a battery state-of-health as a function of temperature, state-of-charge and/or current.

16. The system according to claim 11, wherein said second vehicle comprises a transmitter and said first vehicle comprises a receiver, said transmitter being configured to transmit said second battery model to said receiver in said first vehicle when said first and second vehicles are within a distance of each other allowing direct communication between said first and second vehicles.

17. The system according to claim 16 wherein said transmitter and receiver comprises a vehicle-to-vehicle communication, Bluetooth or WiFi transmitter and receiver.

18. The system according to claim 11, further comprising a battery control server configured to receive and store said updated battery model from said first battery control unit.

\* \* \* \* \*